(12) United States Patent
Hasegawa et al.

(10) Patent No.: US 7,541,909 B2
(45) Date of Patent: *Jun. 2, 2009

(54) FILTER CIRCUIT HAVING AN FE-BASED CORE

(75) Inventors: Ryusuke Hasegawa, Morristown, NJ (US); Ronald J. Martis, East Hanover, NJ (US); Seshu V. Tatikola, Bridgewater, NJ (US)

(73) Assignee: Metglas, Inc., Conway, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/071,368

(22) Filed: Feb. 8, 2002

(65) Prior Publication Data

US 2003/0151487 A1    Aug. 14, 2003

(51) Int. Cl.
    *H01F 27/24* (2006.01)
(52) U.S. Cl. ....................................................... 336/233
(58) Field of Classification Search ......... 336/210–213, 336/233–234; 148/304–306
    See application file for complete search history.

(56) References Cited

U.S. PATENT DOCUMENTS

| | | | |
|---|---|---|---|
| 4,116,728 A | 9/1978 | Becker et al. ............... 148/108 |
| 4,262,233 A | 4/1981 | Becker et al. | |
| 4,264,882 A | 4/1981 | Tsuya et al. ................ 333/141 |
| 4,409,041 A | 10/1983 | Datta et al. | |
| 4,528,481 A * | 7/1985 | Becker et al. ............... 315/248 |
| 4,637,843 A | 1/1987 | Takayama et al. ............. 420/73 |
| 4,812,181 A * | 3/1989 | Hilzinger et al. ............ 148/121 |
| 4,881,989 A * | 11/1989 | Yoshizawa et al. .......... 148/302 |
| 4,926,443 A | 5/1990 | Reich | |
| 4,985,089 A * | 1/1991 | Yoshizawa et al. .......... 148/303 |
| 5,030,933 A | 7/1991 | Ikeda et al. ................. 333/184 |
| 5,159,705 A | 10/1992 | Critchlow et al. | |
| 5,192,375 A | 3/1993 | Sawa et al. .................. 148/306 |
| 5,211,767 A | 5/1993 | Shigeta et al. ............... 148/121 |
| 5,225,006 A | 7/1993 | Sawa et al. .................. 148/304 |
| 5,252,144 A * | 10/1993 | Martis ......................... 148/121 |
| 5,522,948 A | 6/1996 | Sawa et al. .................. 148/308 |
| 5,741,373 A | 4/1998 | Suzuki et al. ................ 148/306 |
| 5,751,207 A | 5/1998 | Poess .......................... 336/233 |
| 5,755,986 A | 5/1998 | Yamamoto et al. ......... 252/62.54 |
| 5,935,347 A | 8/1999 | Suzuki et al. ................ 148/121 |
| 6,004,661 A | 12/1999 | Sakai et al. .................. 428/216 |

(Continued)

FOREIGN PATENT DOCUMENTS

EP          0 299 498 A1 *    1/1989

(Continued)

OTHER PUBLICATIONS

Bozorth, "Ferromagnetism", IEEE Magnetics Society, Wiley-Interscience, pp. 9-10, pp. 838-845 (in English), no date.

(Continued)

*Primary Examiner*—Tuyen T. Nguyen (57) ABSTRACT

A filter circuit is used to select frequency bands of digital and analog signals over communications channels in a DSL communications system. The filter circuit includes an inductor having a core that consists essentially of an Fe-base amorphous metal alloy. Advantageously, the filter circuit provides as good or better performance than a filter circuit using a Co-base core; but is much less expensive. As such, it provides a low cost, high efficiency solution to communications applications, such as DSL communications systems, and the like.

6 Claims, 14 Drawing Sheets

U.S. PATENT DOCUMENTS

| | | | |
|---|---|---|---|
| 6,018,296 A * | 1/2000 | Herzer | 340/572.5 |
| 6,093,261 A * | 7/2000 | Hasegawa et al. | 148/304 |
| 6,307,474 B1 * | 10/2001 | Lian et al. | 340/572.6 |
| 6,350,323 B1 * | 2/2002 | Inoue et al. | 148/304 |
| 6,559,808 B1 * | 5/2003 | Petzold et al. | 343/787 |
| 6,594,157 B2 * | 7/2003 | Yoshida et al. | 363/14 |
| 6,648,990 B2 * | 11/2003 | Yoshizawa | 148/313 |
| 6,930,581 B2 * | 8/2005 | Martis et al. | 336/182 |

FOREIGN PATENT DOCUMENTS

| | | | |
|---|---|---|---|
| EP | 0513385 | | 11/1991 |
| EP | 1063661 | | 6/2000 |
| GB | 2138215 A | * | 10/1984 |
| JP | 06-151143 | * | 5/1994 |
| JP | 6151143 A | | 5/1994 |
| WO | 99/45643 | * | 9/1999 |

OTHER PUBLICATIONS

Chikazumi et al., "Physics of Magnetism", John Wiley & Sons, Inc., pp. 15-35, pp. 498-499 (in English), no date.

Jiles, "Introduction to Magnetism and Magnetic Materials", Chapman and Hall, pp. 40-43 (in English), no date.

Boll, "Weichmagnetische Werstoffe", Vacuumschmelze GmbH, 1990, pp. 80, 206-207, no date.

First Chinese Office Action for corresponding Chinese Patent Application No.: 03807917.8 dated Dec. 21, 2007 (in Engllish).

Chinese Patent Office Action, issued Jun. 13, 2008.

Taiwanese Office Action (Preliminary Notice of Rejection) issued on Dec. 18, 2006 in corresponding Taiwanese Patent Application No. 092102520.

* cited by examiner

FILTER CIRCUIT HAVING AN FE-BASED CORE

RELATED U.S. APPLICATION DATA

This application is related to U.S. patent application Ser. No. 10/071,682 filed Feb. 8, 2002, for Current Transformer Having An Amorphous Fe-Based Core, and to U.S patent application Ser. No. 10/071,990 filed Feb. 8, 2002, for Fe-Based Amorphous Metal Alloy Having A Linear BH Loop, both of which are assigned to the assignee of the present application.

BACKGROUND OF THE INVENTION

1. Field of the Invention

The present invention relates to the field of digital and analogue information transmission; and, more particularly, to a filter circuit having an Fe-based amorphous metal core, for bandpass filtering in telecommunication applications, such as DSL communications circuits, and the like.

2. Description of the Prior Art

Telephone communication lines are presently used to produce a wide variety of signals for both commercial and domestic users of a product or service. Such a product or service, of course, includes normal voice telephone and communications, as well as a growing number of ancillary services. Ancillary services are generally directed towards the transmission of information over existing telephone lines. This information presently includes computer data, i.e., transmitted over two-way Internet connections, as well as a growing number of other ancillary services. Those further ancillary services which are currently under development, or contemplated, include one-way and two-way continuous broadcast information, such as audio only (radio), video streams, mixed audio/video streams, and the like.

The foregoing modes of communication are made possible by existing telephone lines, which provide a network capable of carrying a broad range of this information. While available bandwidths generally range from about 0 to 3000 kHz, the actual bandwidth requirements for conventional voice-only telecommunications is in the neighborhood of up to about 6 kHz. Thus, there exists the potential for the use of this existing network to transmit communications at higher frequencies.

The technique of providing information within a certain range of frequencies, i.e., a limited "bandwidth" enables the simultaneous transmission of different signals along a single circuit. This eliminates the need for multiple circuits wherein the signal being transmitted along communication lines can be maintained within separate frames of frequencies, i.e., separate bandwidths within the available frequency spectrum for a circuit. Conventionally, this has been accomplished by use of a "bandpass filter", which typically include a coil and a capacitor. The operating characteristics of the coil and capacitor are selected such that only a limited subset of the total available frequency spectrum passes through the communication lines. Bandpass filters are typically placed between the source of communications and the communication lines, thereby limiting the output of the communications device to fall solely within the frequency range established for the particularly bandpass filter. A plurality of bandpass filters, each having outputs of non-overlapping frequency ranges within an available spectrum can also be used, and thus a plurality of communication devices can share common communication lines.

In the past, choke coils have been used in telecommunication circuits. While advantageous, the use is not without shortcomings. Such shortcomings include incompatibility of controlling desired choke coil performance needed for pertinent use such as in band pass filter circuits. These shortcomings have created a need for materials having "softer" and more controllable magnetic properties. In certain cases cobalt containing amorphous metal alloys have been used to form choke coil cores. Although more prevalent and less expensive, iron-rich amorphous metal cores have not been used in choke coil cores, since their inductance properties were believed unsuitable for use in bandpass filters.

SUMMARY OF THE INVENTION

The present invention provides an inductor having a core consisting essentially of an Fe-base amorphous metal alloy.

In one aspect, the permeability of the core is substantially constant over a frequency range of approximately 1 to 1000 kHz. Specifically, the permeability of the core is substantially constant over a field strength range of approximately −15 to +15 Oersteds (Oe).

In another aspect, the invention provides a filter circuit containing a coke coil that comprises a core having permeability substantially constant over a frequency ranging from about 1 to 1000 kHz.

In yet another aspect, the invention provides a method for segmenting frequency communications, employing a filter circuit having core permeability substantially constant over a field strength of approximately −15 to +15 Oe.

Advantageous structural features are incorporated into the elements of the present invention. A filter circuit that includes a core made from an Fe-base amorphous metal alloy provides as good or better performance than a filter circuit using a Co-base core. Moreover, cores composed of Fe-base amorphous alloys are much less expensive than Co-base cores. As such, Fe-base amorphous metal alloy cores provide a low cost solution to communications applications that require a filter circuit. Filter circuits using Fe-base cores are especially suited for use in communications applications that require an adjustable bandpass filter for selecting frequency bands of digital and analog signals over communications channels such as DSL and the like.

BRIEF DESCRIPTION OF THE DRAWINGS

The invention will be more fully understood and further advantages will become apparent when reference is had to the following detailed description of the preferred embodiment of the invention and the accompanying drawings, in which.

DETAILED DESCRIPTION

Figure 1:
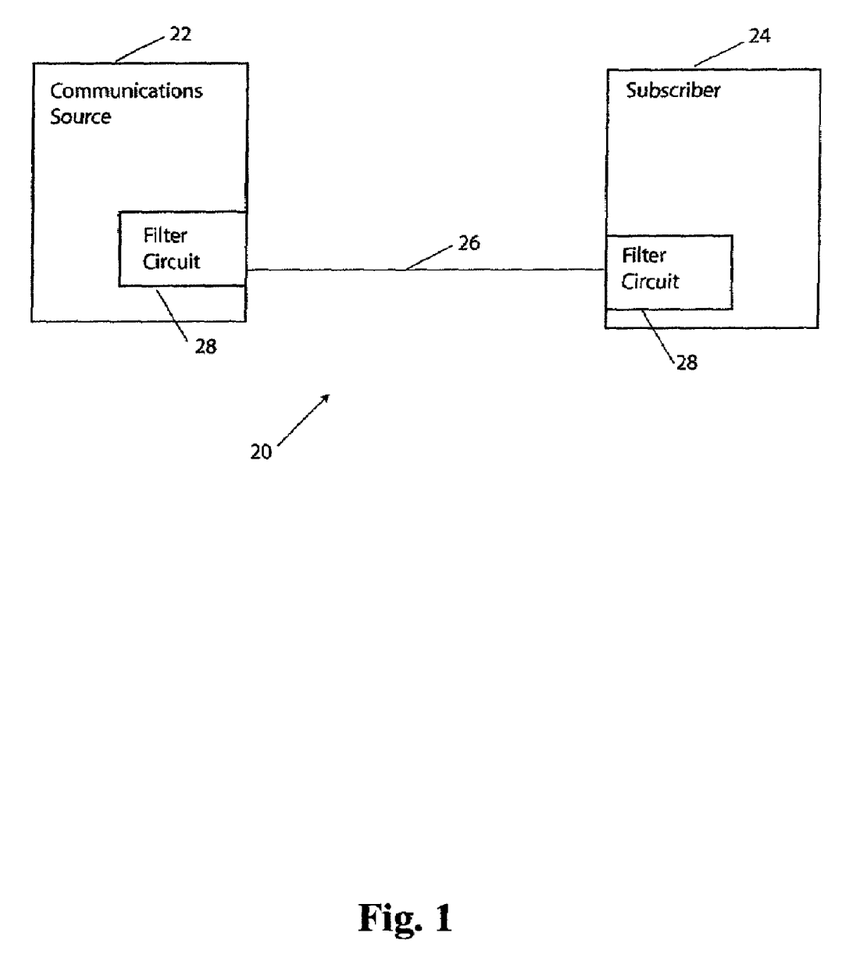
FIG. 1 is a diagrammatic view showing a communications system in accordance with the present invention.

Referring to FIG. 1 of the drawings, there is shown a communications system 20 according to the invention. Communications source 22, such as a telephone central office, uses DSL technology to deliver high bandwidth analog and digital signals to subscribers 24, such as a business or home, over a communications channel 26. A filter circuit 28, such as a bandpass filter circuit, can be placed at the central office 22 and at the subscriber 24. The operating characteristics of the filter circuit 28 can be adjusted to limit the frequency spectrum passing through communication line 26. In an alternative embodiment, the filter circuit 28 can be a low pass filter, the operating characteristics of which are adjusted to limit the frequency ranges that are allowed to pass.

Figure 2A:
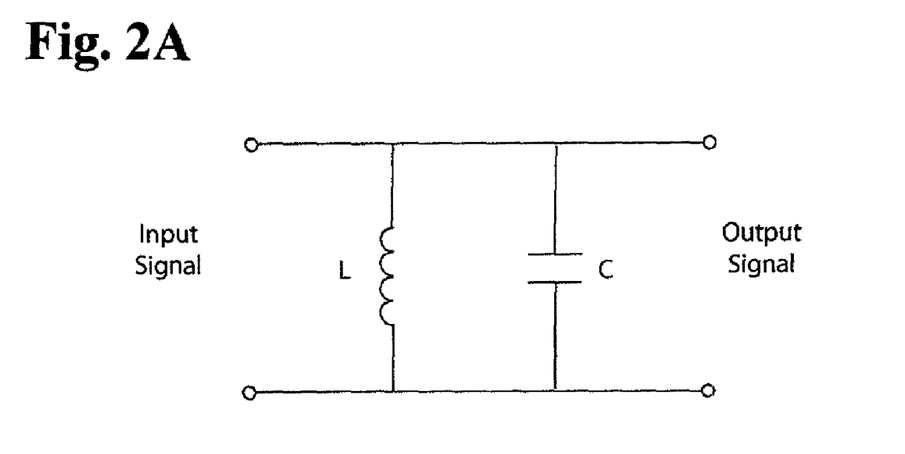
FIG. 2A is a circuit diagram showing a filter circuit of the invention.
Figure 2B:
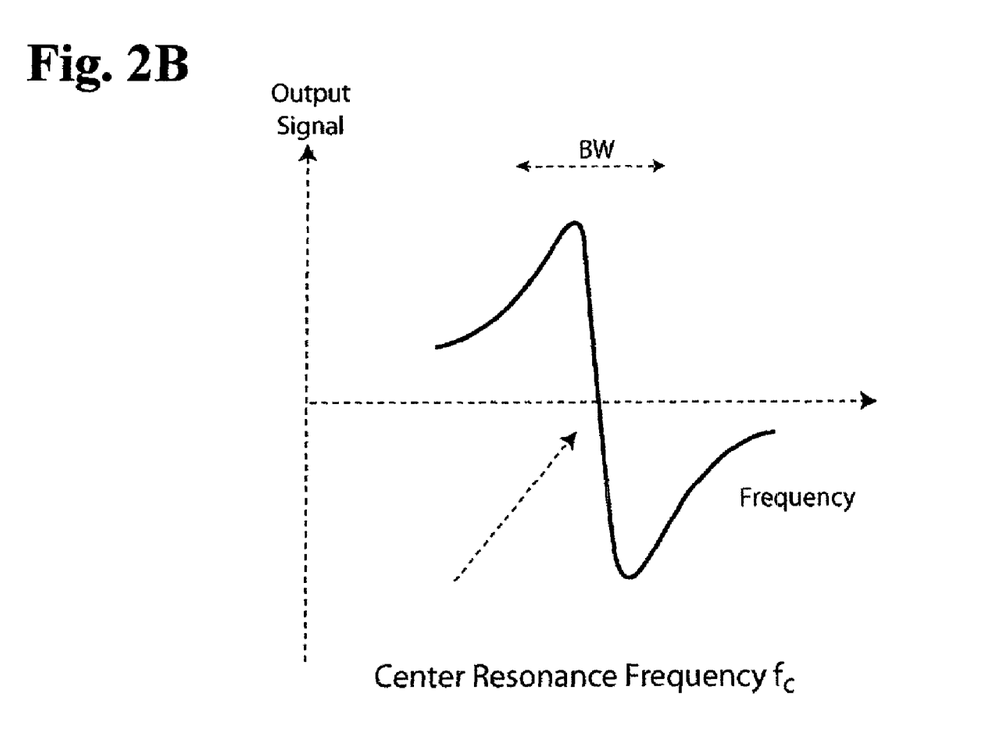

FIG. 2A is a circuit diagram showing a filter circuit 28 of FIG. 1 according to the invention. In one embodiment, the filter circuit of FIG. 2A is a bandpass filter circuit comprising an electrical choke L and a capacitor C combined in a parallel arrangement. The filter circuit of FIG. 2A accepts an input signal and produces an output signal that is dependent on the frequency of the input signal and the operating characteristics of the filter circuit. Referring to FIG. 2B, the filter circuit of FIG. 2A has a center resonance frequency $f_c = 1/([2\pi(LC)^{1/2}]$, where L is the inductance of the inductor L and C is the capacitance of the capacitor. The filter circuit has a bandwidth BW representing the range of frequencies that are passed relative to the center resonance frequency $f_c$. A particular center resonance frequency $f_c$ and BW is selected by adjusting the values of the inductor L and/or capacitor C. For example, in a DSL embodiment, there are used one or more filter circuits, each having its own center resonance frequency $f_c$ so that each filter circuit passes signals in certain sub-bands within the specific kHz bandwidth used in a DSL communications system.

The inductor L is an energy storage element comprising a ferromagnetic core wound with current carrying wire. For a toroidal shaped inductor, the stored energy is $W = \frac{1}{2}[(B^2 A_c l_m)/(2\mu_0 \mu_r)]$ where B is the magnetic flux density, $A_c$ is the effective magnetic area of the core, $l_m$ is the mean magnetic path length, $\mu_0$ is the permeability of free space, and $u_r$ is the relative permeability in the material.

By introducing a small gap in the toroid, the magnetic flux in the air gap remains the same as in the ferromagnetic core material. However, since permeability of the air ($\mu \approx 1$) is significantly lower than in typical ferromagnetic material ($\mu \approx$ several thousands) the magnetic field strength (H) in the gap becomes much higher than in the rest of the core ($H = B/\mu$). The energy stored per unit volume in the magnetic field is $W = \frac{1}{2}(BH)$, indicating it is primarily concentrated in the air gap. In other words, the energy storage capacity of the core is enhanced by the introduction of the gap.

The gap can be discrete or distributed. A distributed gap can be introduced by using ferromagnetic powder held together with nonmagnetic binder or by partially crystallizing an amorphous alloy. In the second case, ferromagnetic crystalline phases are separate and are surrounded by nonmagnetic matrix. This partial crystallization mechanism is utilized in connection with the choke of the present invention.

Figure 3:
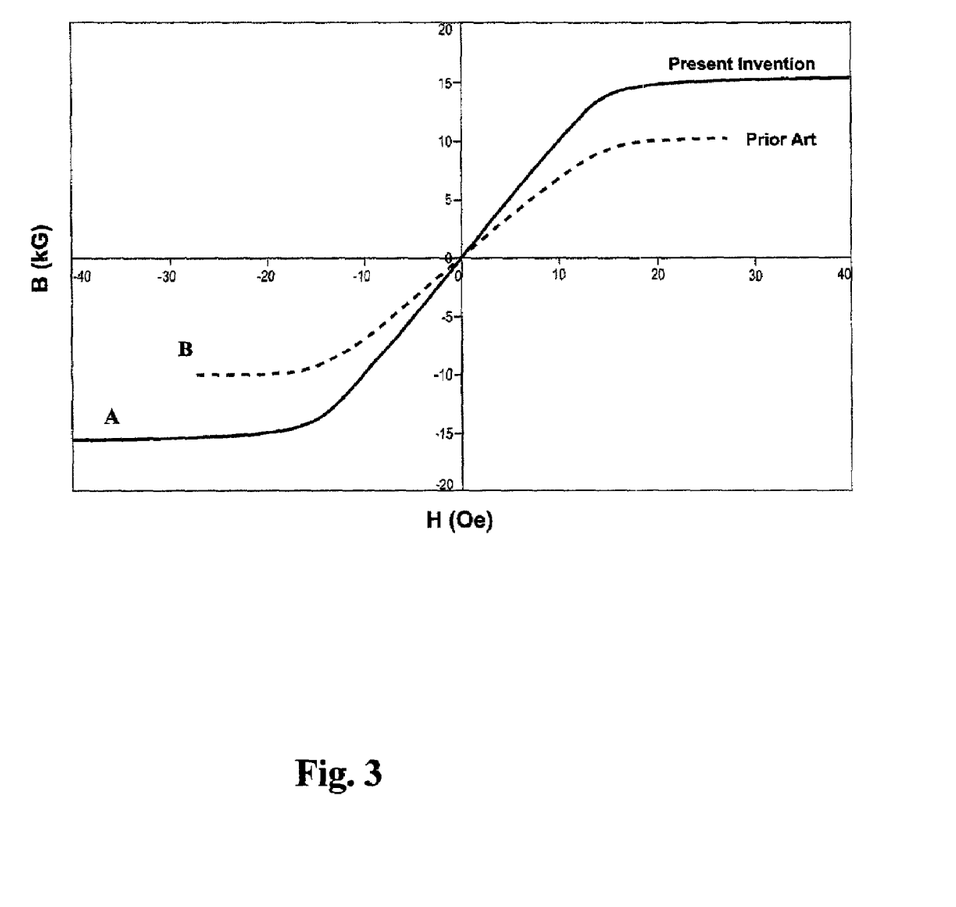
FIG. 3 is a graph showing both a magnetization curve of a core according to the invention (curve A) and a magnetization curve of a prior art core (curve B).

FIG. 3 is a graph depicting magnetization curves for an Fe-based amorphous alloy core according to the invention and a prior art core based on a Co-rich amorphous alloy. The graph indicates that the permeability defined by $\mu = B/H$ of the core of the present invention is substantially linear. The magnetic field strength H is varied over a range from about −40 Oe to +40 Oe causing a linear change in the corresponding magnetic flux density B over a range of about +13 to −13 kG. The linear permeability property makes the Fe-based core suitable as a bandpass filter circuit in a DSL communication system. The permeability of the prior art core on the other hand is linear only up to the induction level of about 7 kG, which is substantially lower than the 13 kG level reached in the Fe-based core of the present invention. The larger available induction level of the core according to the present invention is desirable because the core can be operational with larger current levels in telecommunication lines.

Figure 4A:
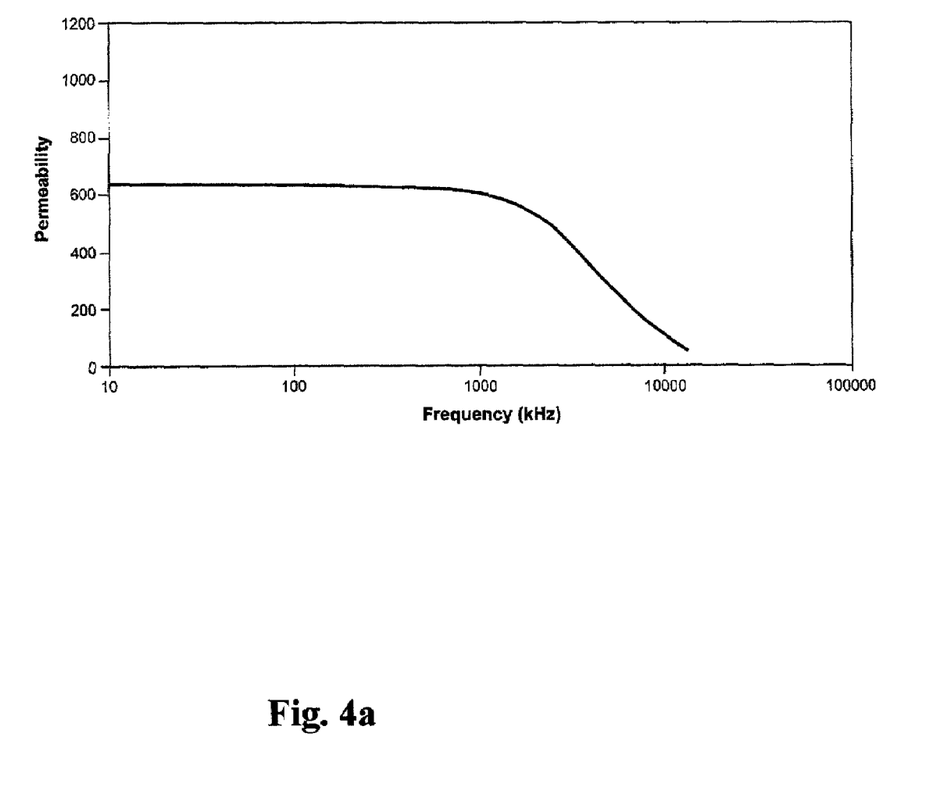
FIG. 4A is a graph depicting permeability of a core of the invention as a function of applied frequency.

FIG. 4A is a graph depicting the functional relationship between core permeability and applied field frequency for a bandpass filter of the invention. An alternating current (AC) signal is applied to a bandpass filter having a core consisting essentially of an Fe-base amorphous metal alloy with a permeability of approximately 700. The frequency is varied over a range of 1-10,000 kHz while the permeability is measured. The graph indicates that the permeability is constant up to about 1000 kHz range. The permeability then gradually decreases linearly from 700 to 20 as the frequency is varied from 1000 kHz to 20,000 kHz.

Figure 4B:
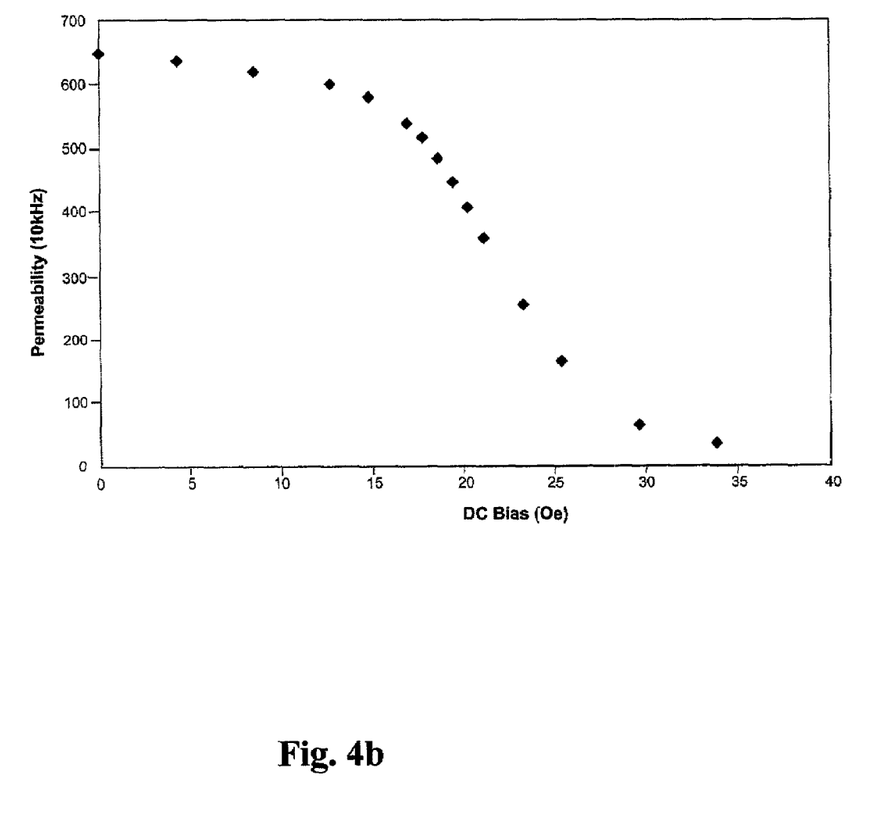
FIG. 4B is a graph depicting permeability of a core of the invention as a function of applied field strength.

FIG. 4B is a graph depicting core permeability as a function of applied field strength for a bandpass filter of the invention. A bandpass filter having a Fe-based core with a permeability of approximately 700 is subjected to a magnetic field H that is varied over a range of 0 to 35 Oe while the permeability of the core is measured. The graph indicates that the permeability does not vary appreciably within a magnetic field H range of approximately 0 to 15 Oe. The permeability gradually decreases from 700 to 300 in a linear fashion as the magnetic field H is varied past 17 Oe. The ferromagnetic core can be used in a filter circuit as part of a communications circuit such as DSL. The ferromagnetic core exhibits a magnetic permeability that is linear as the frequency and magnetic field strength is varied over a range that is representative of a communications application such as DSL.

Figure 5:
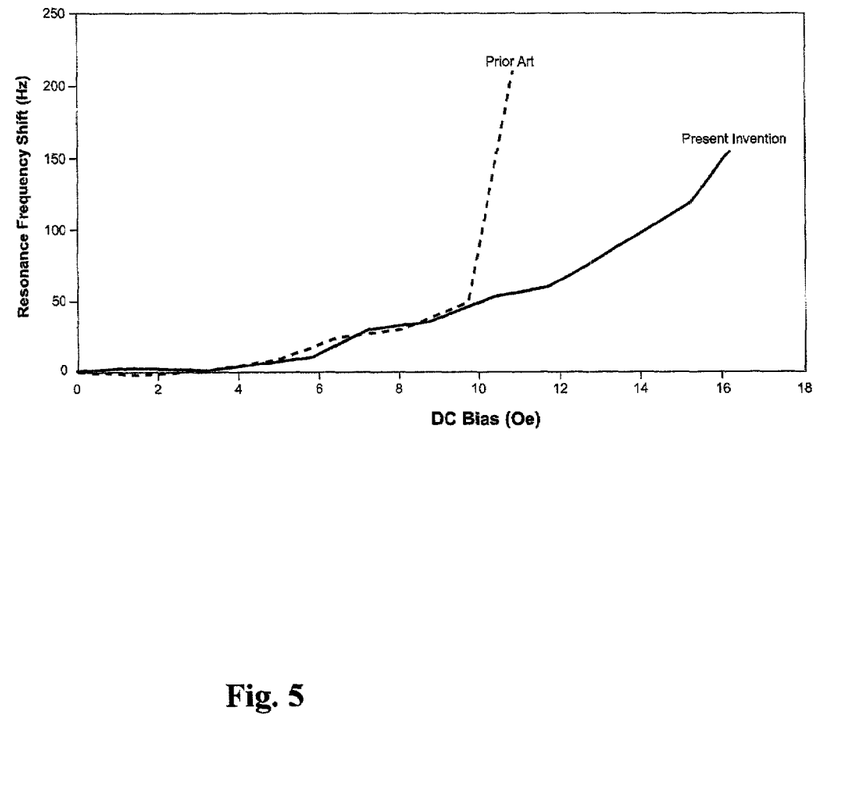
FIG. 5 is a graph depicting the shifts of the center resonance frequency $f_c$ shown in FIG. 2B as a function of DC bias field for the cores according to the present invention and a prior art core.
Figure 6A:
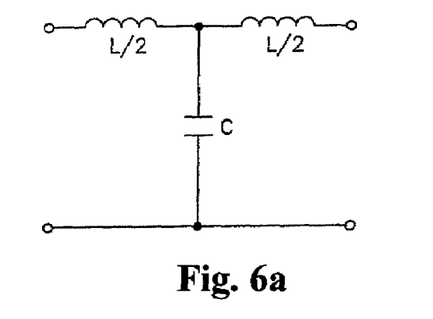
FIGS. 6A-D are circuit diagrams containing examples of bandpass filter circuits using cores constructed in accordance with the present invention.
Figure 6B:
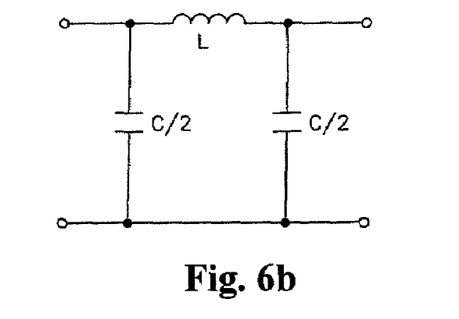
Figure 6C:
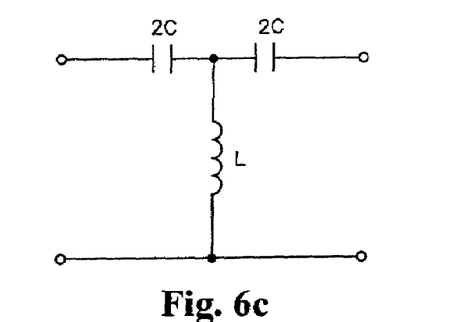
Figure 6D:
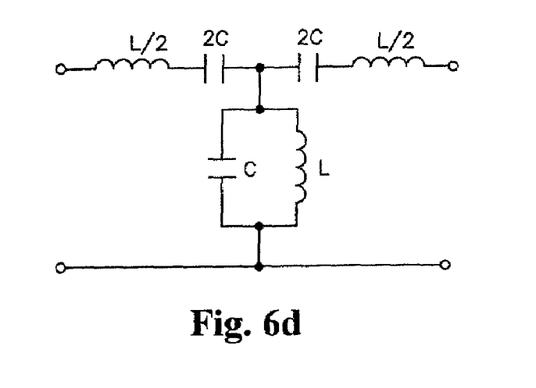

FIG. 5 compares the shifts of the center resonance frequency $f_c$ defined in FIG. 2B for the core according to the present invention and a prior art core. Each of these cores with OD of about 13 mm, ID of about 8 mm and a height of about 7 mm with 150 copper winding resulted in an inductance L of about 8 mH. The inductor was connected in parallel with a capacitor of 1 μF, which resulted in a center resonance frequency $f_c$ of about 1800 Hz. The prior art core saturates with a DC bias field above 10 Oe beyond which the core becomes non-functional, whereas the core according to the present invention is operational well past 10 Oe. Lower center resonance frequency shifts are desirable for stable filter operations.

FIG. 6 shows examples of bandpass filter circuits in which the Fe-based cores according to the present invention are utilized in the inductors L. All of these circuits have the same center resonance frequency given by $1/[2\pi(LC)^{1/2}]$.

Figure 7:
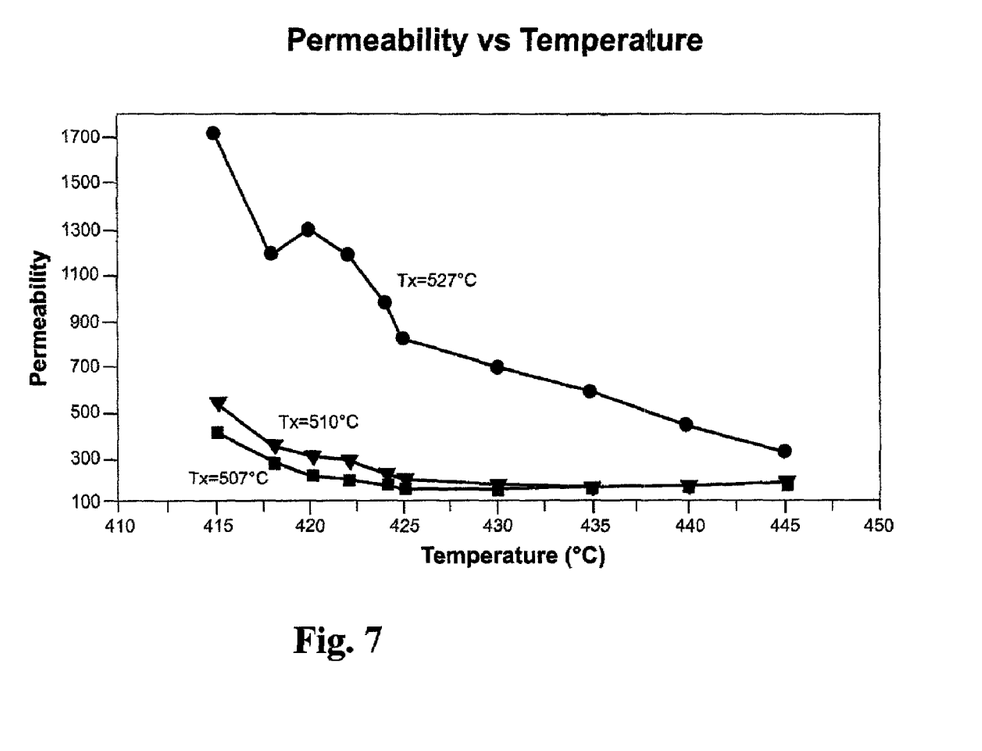
FIG. 7 is a graph depicting the relationship between core permeability and annealing temperature, the different curves describing material with different crystallization temperatures.

FIG. 7 is a graph depicting the relationship between the permeability of the core and annealing temperature, the different curves describing material with different crystallization temperatures, $T_x$. The permeability was measured with a commercially available inductance bridge at 10 kHz frequency, 8-turn jig and 100 mV AC excitation. The annealing time was kept constant at 6 hrs. All the cores were annealed in an inert gas atmosphere. The different curves represent Fe-base alloys with small variations in the chemical composition and consequently small changes in their crystallization temperature. The crystallization temperatures were measured by Differential Scanning Calorimetry (DSC). A reduction in the permeability is observed with increasing annealing temperature for a constant annealing time. For a given annealing temperature the permeabilities scale according to the crystallization temperature, i.e. the permeability is highest for the alloy with the highest crystallization temperature.

Figure 8:
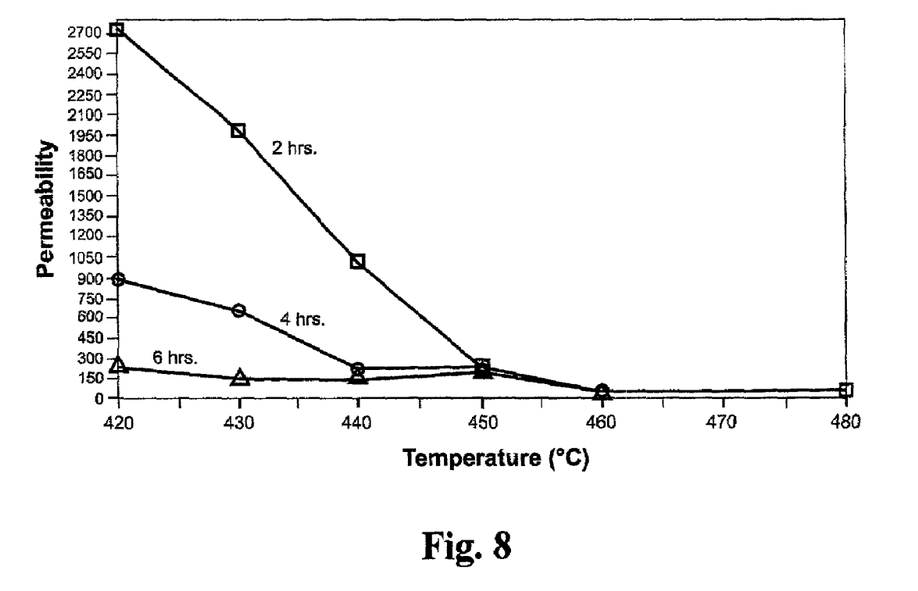
FIG. 8 is a graph depicting the relationship between core permeability and annealing temperatures for different annealing times.

FIG. 8 depicts the permeability of the annealed Fe-base cores with the same chemical composition as a function of the annealing temperature. The different curves represent different annealing times. The plot indicates that for temperatures higher than 450° C. the effect of the annealing temperature dominates the effect of the annealing time.

The appropriate annealing temperature and time combination are selected for an Fe base boron and silicon containing amorphous metal alloy on the basis of the information in FIGS. 7 and 8. This selection can be made provided the crystallization temperature ($T_x$) and/or chemical composition of the alloy is known. For example, for $Fe_{80}B_{11}Si_9$ which has $T_x=507°$ C. in order to achieve permeabilities in the range of 100 to 400 annealing temperatures in the range of 420 to 425° C. for 6 hrs are appropriate. To achieve a permeability of about 700, an amorphous Fe-based alloy with $T_x=527°$ C. is heat-treated at 430° C. for 6 hours as taught by FIG. 7.

Improvements in the linearity of the permeability were achieved by applying a magnetic field perpendicular to the core's magnetic excitation direction during the heat-treatment. For example, the Fe-based cores of the present invention used for FIGS. 3, 4A, 4B and 5 were heat-treated with a perpendicular magnetic field of about 200 Oe. The field-annealing is performed in conjunction with the teaching of FIGS. 7 and 8.

Figure 9:
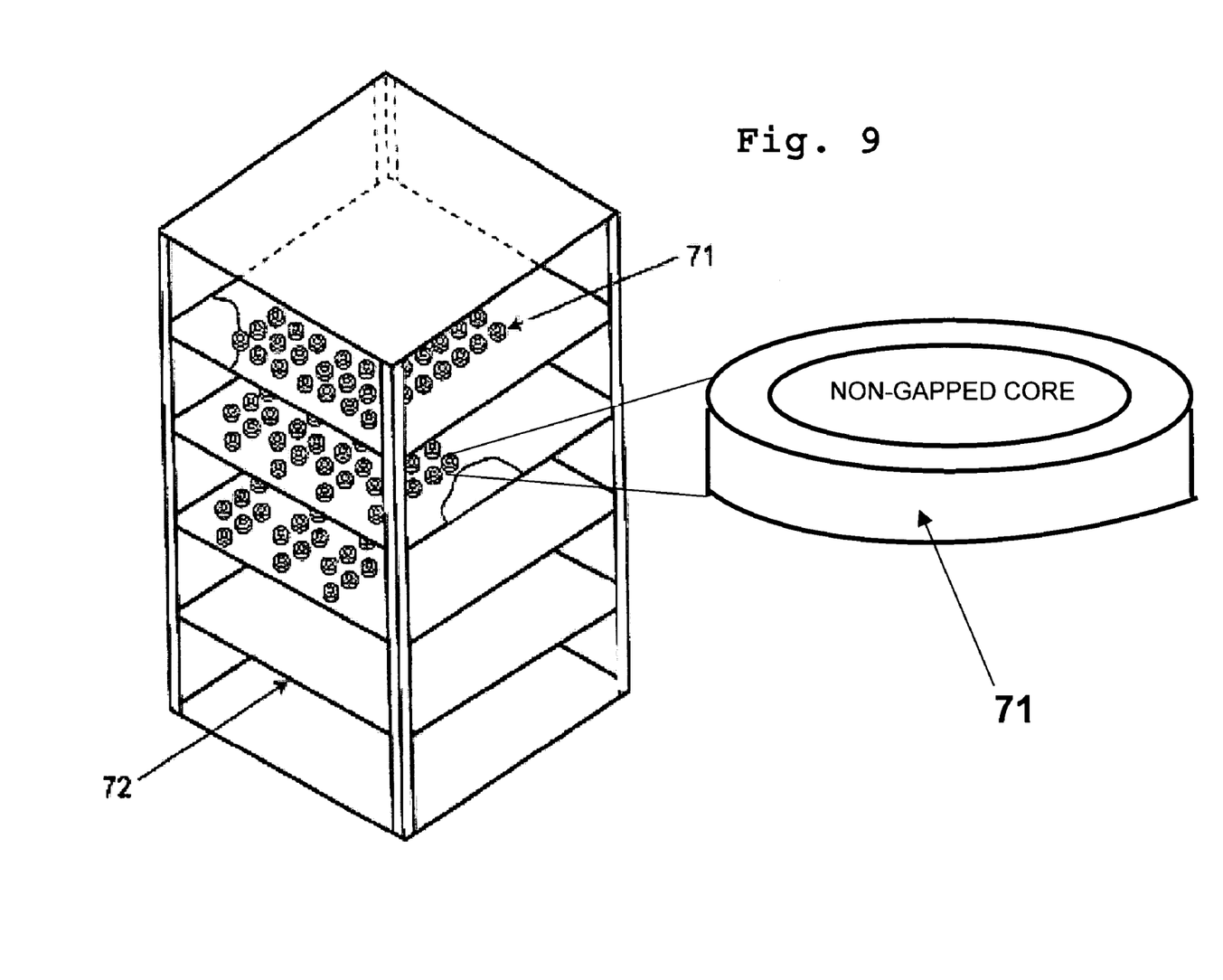
FIG. 9 is a graph depicting the loading configurations of the cores for the annealing in order to achieve temperature uniformity within a few degrees.

Referring to FIG. 9, it is shown that the reproducibility and uniformity for a given permeability value are obtained when a temperature variation of less than one or two degrees is maintained. Special loading configurations have been developed for the annealing process so that the uniformity and reproducibility of the temperature in the oven are established. For a box type inert gas oven, wire mesh Al plates 72 are stacked according to FIG. 9 and the arrangement is placed in the center of the oven. The Al plates 72 are substrates that hold the cores 71 during the anneal process.

Figure 10:
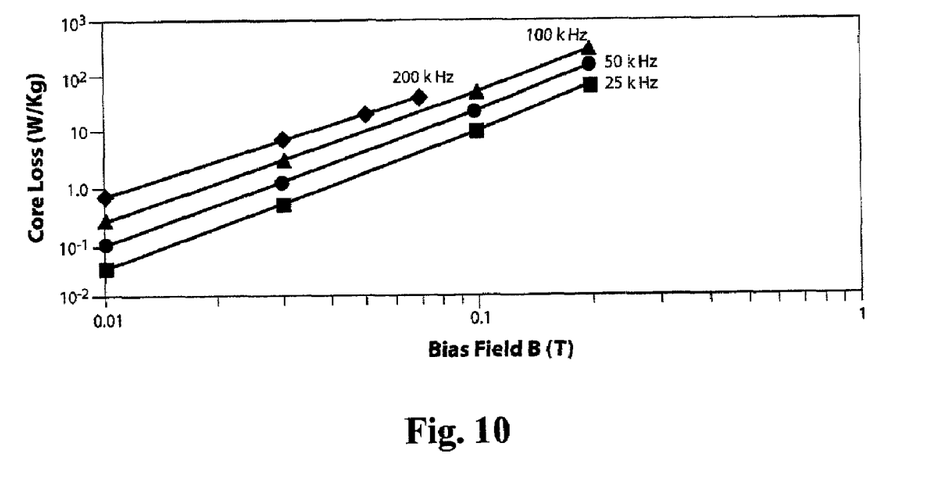
FIG. 10 is a graph depicting core loss as a function of DC bias field and frequency.
Figure 11:
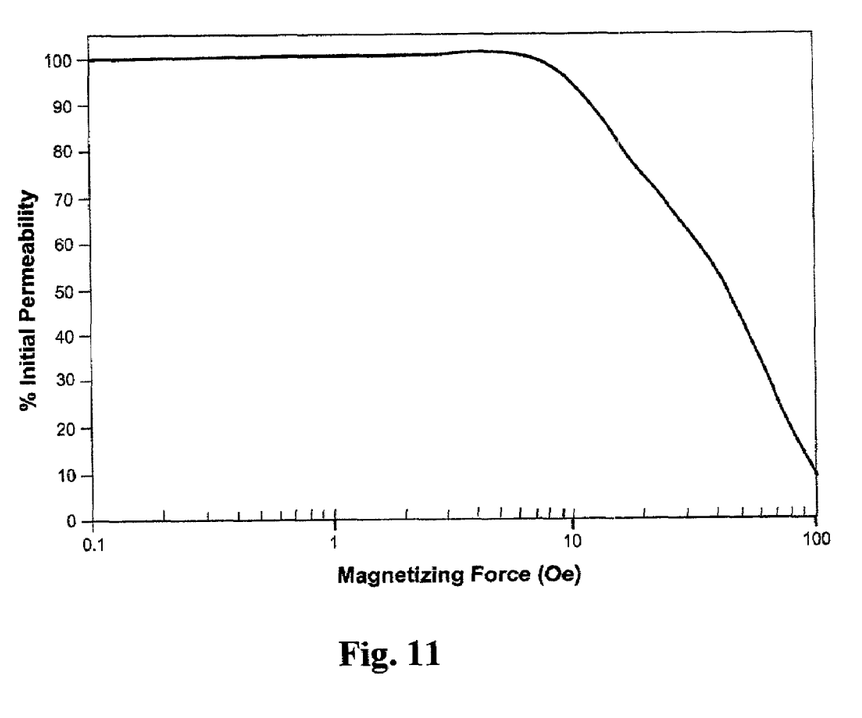
FIG. 11 is a graph depicting the permeability of the cores as a function of DC magnetizing force.

Typical magnetic characterization data for the inductor cores, such as core loss and DC bias are shown in FIGS. 10 and 11. The core loss data are plotted as a function of the DC bias field and the different curves represent different measuring frequencies. The data shown are for cores with an OD of 25 mm. An important parameter for the core performance is the percent of the initial permeability that remains when the core is driven by a DC bias field. FIG. 11 depicts a typical DC bias curve for a core having an OD of 35 mm.

Figure 12:
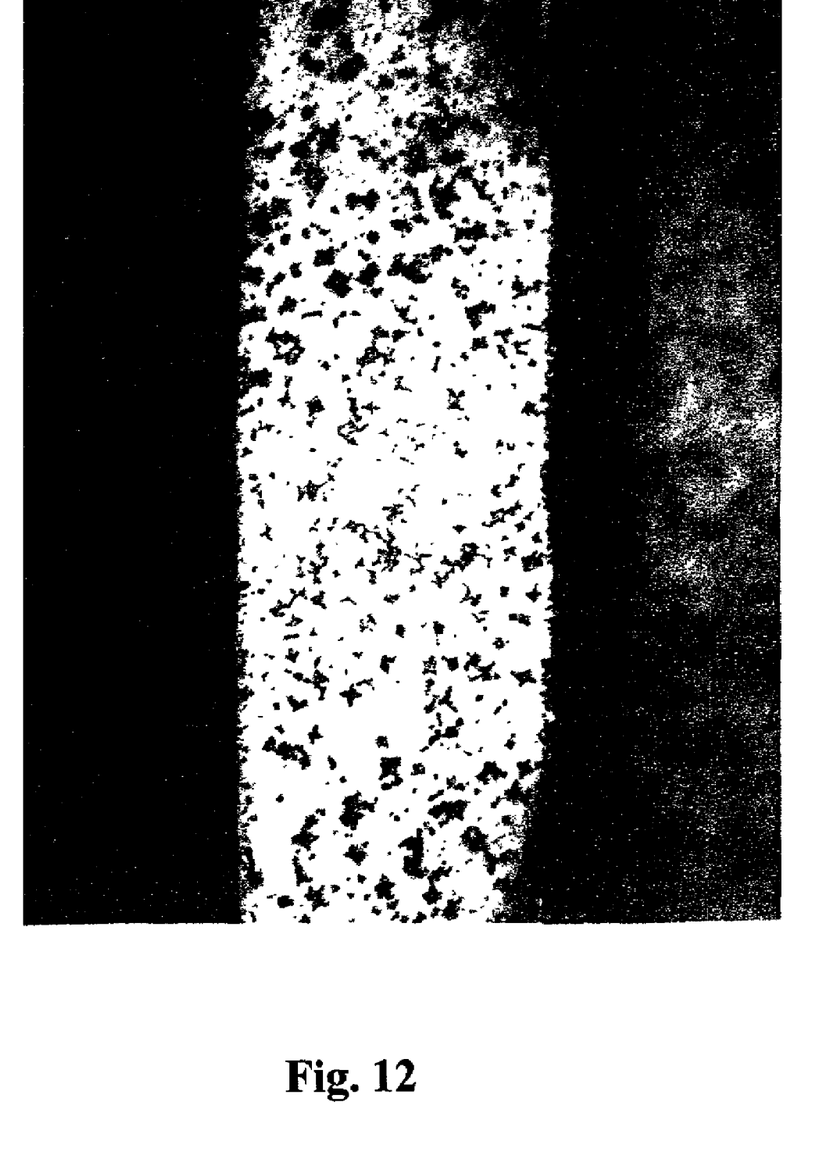
FIG. 12 is a Scanning Electron Microscopy (SEM) picture showing a cross-section of the ribbon after annealing.
Figure 13:
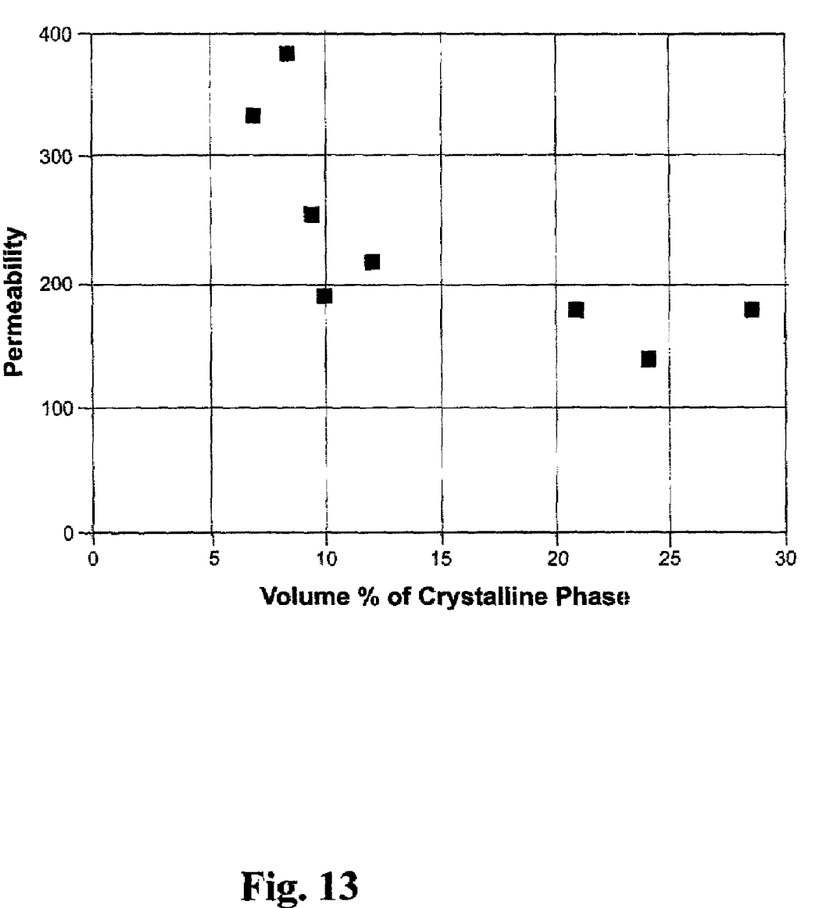
FIG. 13 is a graph depicting core permeability as a function of the volume percent of crystallinity.

Cross-sectional scanning electron microscopy (SEM) and x-ray diffraction (XRD) were performed to determine the distribution and percent crystallization of the annealed cores. FIG. 12 depicts a typical cross-sectional SEM indicating that both the bulk of the alloy having a thickness of about 20 μm and the surface are crystallized. The volume percent of the crystallization was determined from both the SEM and XRD data and is plotted in FIG. 13 as a function of permeability. For permeabilities in the range of 100 to 400 bulk crystallization in the range of 5 to 30% is required.

Having thus described the invention in rather full detail, it will be understood that such detail need not be strictly adhered to, but that additional changes and modifications may suggest themselves to one skilled in the art. For example, a filter circuit having an Fe-based amorphous metal core can be used in communications other than DSL. These and other embodiments are intended to fall within the scope of the invention, as defined by the subjoined claims.

What is claimed is:

1. A bandpass filter, comprising an inductor having a non-gapped core that consists essentially of an Fe—B—Si amorphous alloy ribbon with Fe content in a vicinity of 80 atomic percent and having a crystallization temperature ranging from 500° C. to 530° C. and heat-treated below the alloy's crystallization temperature, a linear BH loop and a constant permeability ranging from 400 to 1000 over a frequency range of about 1 to 1000 kHz, wherein the permeability is linear up to an induction level of 13 kG.

2. A bandpass filter as recited by claim 1, wherein said constant permeability is extant over a field strength range of approximately −15 to +15 Oe.

3. A bandpass filter as recited by claim 1, wherein the bandpass filter is utilized to select frequency bands in communication systems.

4. A bandpass filter, comprising:
an inductor having a non-gapped core consisting essentially of an Fe-based amorphous metal alloy ribbon with an Fe content in a vicinity of 80 atomic percent and having crystallization temperature ranging from 500° C. to 530° C., heat-treated below the alloy's crystallization temperature, and having a linear BH loop having a squareness ratio that approaches zero over a field strength range of approximately −15 to +15 Oersteds,
wherein the permeability of the core is constant at near zero field over a field strength range of approximately −15 to +15 Oersteds (Oe).

5. The bandpass filter of claim 1, wherein the center frequency of said filter has frequency shifts of less than 50 Hz up to the bias field of 10 Oe.

6. A bandpass filter, comprising an inductor having a non-gapped core that consists essentially of an Fe—B—Si amorphous alloy ribbon with Fe content in a vicinity of 80 atomic percent and having a crystallization temperature ranging from 500° C. to 530° C. and heat-treated below the alloy's crystallization temperature, a linear BH loop and a constant permeability ranging from 400 to 1000 over a frequency range of about 1 to 1000 kHz, wherein the permeability is linear up to an induction level of 13 kG.

* * * * *